(12) United States Patent
Winters

(10) Patent No.: US 6,771,028 B1
(45) Date of Patent: Aug. 3, 2004

(54) DRIVE CIRCUITRY FOR FOUR-COLOR ORGANIC LIGHT-EMITTING DEVICE

(75) Inventor: Dustin Winters, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/426,555

(22) Filed: Apr. 30, 2003

(51) Int. Cl.[7] .................................................. G09G 3/10
(52) U.S. Cl. ................................ 315/169.1; 315/169.3; 345/76
(58) Field of Search .......................... 315/169.1, 169.3; 345/76, 77

(56) References Cited

U.S. PATENT DOCUMENTS

| | | |
|---|---|---|
| 6,281,634 B1 | 8/2001 | Yokoyama |
| 6,456,013 B1 | 9/2002 | Komiya et al. |
| 6,522,079 B1 | 2/2003 | Yamada |
| 6,686,699 B2 * | 2/2004 | Yumoto ................... 315/169.3 |
| 2002/0070909 A1 | 6/2002 | Asano et al. |
| 2002/0186214 A1 | 12/2002 | Siwinski |

* cited by examiner

Primary Examiner—David Vu
(74) Attorney, Agent, or Firm—Raymond L. Owens

(57) ABSTRACT

A four-color organic light-emitting device having pixels which emit light includes a substrate; pixels arranged in rows and columns and each pixel including groups of four subpixels disposed over the substrate and wherein each subpixel includes spaced apart first and second electrodes; and organic EL media disposed between the first and second electrodes of each subpixel. The device also includes drive circuitry disposed relative to the organic EL media over the substrate and arranged to drive each group of four subpixels and having an electrical connection to the first electrode corresponding to each subpixel, and wherein the drive circuitry for each group of four subpixels including four data lines, two power lines, and one select line, the four data lines being shared for each column of the array of pixels, and the select line being shared for each row of the array of pixels.

36 Claims, 9 Drawing Sheets

DRIVE CIRCUITRY FOR FOUR-COLOR ORGANIC LIGHT-EMITTING DEVICE

CROSS REFERENCE TO RELATED APPLICATIONS

Reference is made to commonly assigned U.S. patent application Ser. No. 10/426,299 filed concurrently herewith by Ronald S. Cok et al., entitled "A Color OLED Display With Improved Power Efficiency", the disclosures of which are herein incorporated by reference.

FIELD OF THE INVENTION

The present invention relates to four-color light-emitting devices.

BACKGROUND OF THE INVENTION

Full color organic electroluminescent (EL) devices, also known as organic light-emitting devices or OLED, have recently been described that are constructed of pixels having four subpixels that are red, green, blue, and white in color. Such an arrangement is known as an RGBW design (see U.S. Patent Application Publication 2002/0186214). This type of organic EL device is typically constructed using a white organic EL emitting layer with red, green, and blue color filters. The white subpixel area is left unfiltered. This design has the advantage of lower power consumption and current density, compared to a three-color filtered white-emitting organic EL device when used in applications, which make frequent use of white backgrounds such as the typical personal digital assistant or computer display.

Organic EL devices are frequently driven by active matrix circuitry. Several circuitry layouts are known in the art. The most common circuit layout is known as a stripe pattern, in which each pixel contains several subpixels aligned in a row. The driving circuitry for a stripe design consists of a select line to select each row of pixels. Data lines run perpendicular to the select line and are used to determine the brightness of each pixel in the row. To operate a stripe pattern active matrix organic EL device, each row is selected by applying a voltage to the select line, and the brightness level for each subpixel is controlled by a voltage signal held on the data line. Examples of stripe patterns are shown in U.S. Pat. No. 6,281,634.

A second type of circuitry layout is known as a delta pattern. In a delta pattern, the subpixels are not aligned in a row, but are instead laid out in a triangular pattern. Examples of delta patterns are shown in U.S. Pat. No. 6,456,013 and U.S. Patent Application Publication 2002/0070909. Delta patterns are frequently preferred over stripe patterns because the three subpixels are closer to one another than in a stripe, which can provide a preferred appearance to the viewer.

However, conventional delta designs are only useful for devices that have three different color subpixels and therefore are not appropriate to a four-color display. Conventional stripe pattern circuits, if applied to a four-subpixel design, would require the subpixels to be arranged in a 1×4 matrix. This approach results in the first and fourth subpixels being spaced far from one another, which results in a less preferred appearance to the viewer. Therefore, a pixel circuit that arranges the subpixels closer together is required.

The addition of a fourth subpixel element increases the number of active matrix circuit components (such as transistors and capacitors) and connection lines (such as the data and power lines) required for each pixel. In a bottom-emitting device, that is a device in which light emerges through the substrate that includes the circuitry, the circuitry can block some of the light emission. The ratio of the area of light emission to the area of non-emission is known as aperture ratio. Higher aperture ratio is desirable, as lower aperture ratio devices will require increased current density to achieve the desired average brightness of light emission. It is known that organic EL devices degrade more rapidly at higher current densities, decreasing the useful lifetime of the display. In a top-emitting device, that is a device in which light emerges from the direction opposite the circuitry, the aperture ratio is not affected by an increased number of circuit components and connection lines. However, the number of circuit components and connection lines for either top- or bottom-emitting devices will limit the minimum size of a pixel that can be constructed and therefore the overall resolution of a design. Therefore, new pixel designs that reduce the surface area used by the circuit components and connection lines are required.

SUMMARY OF THE INVENTION

It is therefore an object of the present invention to provide improved drive circuitry for a four-color organic light-emitting device having pixels, which emit light.

This object is achieved by a four-color organic light-emitting device having pixels which emit light, comprising:
  a) a substrate;
  b) pixels arranged in rows and columns and each pixel including groups of four subpixels disposed over the substrate and wherein each subpixel includes spaced apart first and second electrodes;
  c) organic EL media disposed between the first and second electrodes of each subpixel;
  d) drive circuitry disposed relative to the organic EL media over the substrate and arranged to drive each group of four subpixels and having an electrical connection to the first electrode corresponding to each subpixel, and wherein
  e) the drive circuitry for each group of four subpixels including four data lines, two power lines, and one select line, the four data lines being shared for each column of the array of pixels, and the select line being shared for each row of the array of pixels.

ADVANTAGES

The invention has the advantage over conventional designs, such a stripe and delta circuits, in that the four subpixels can be arranged and driven in a 2×2 matrix. This invention also reduces the surface area of the circuit components and connections. This allows for either an improved aperture ratio or a greater possible number of pixels per unit area.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "OLED device" is used in its art recognized meaning of a display device comprising organic light-emitting diodes as pixels and will also be referred to as an organic light-emitting device. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of producing light in the red, green, and blue regions of the visible spectrum and displaying images in any combination of hues. The red, green, and blue colors constitute the three primary colors from which all other colors can be generated by appropriately mixing these three primaries. The term "hue" refers to the intensity profile of light emission within the visible spectrum, with different hues exhibiting visually discernible differences in color. The term "pixel" is employed in its art recognized usage to designate an area of a display panel that can be stimulated to emit light independently of other areas. The pixel or subpixel is generally used to designate the smallest addressable unit in a display panel. The term "subpixel" is used in multicolor display panels and is employed to designate any portion of a pixel, which can be independently addressable to emit light of a specific color. For example, a blue subpixel is that portion of a pixel, which can be addressed to produce blue light.

Figure 1:
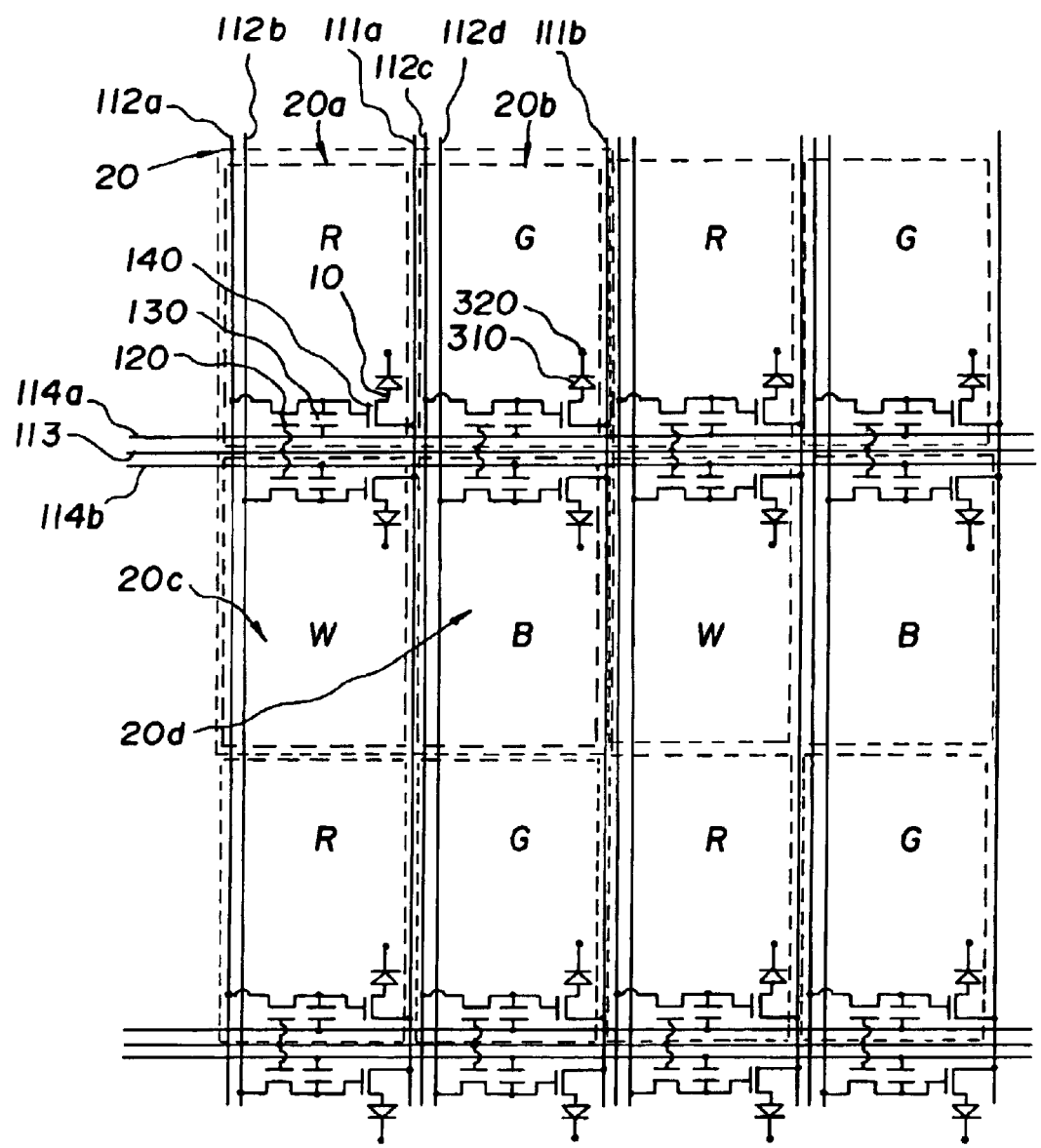
FIG. 1 shows a circuit pattern diagram according to a first embodiment of the present invention.

Turning now to FIG. 1, there is shown a circuit pattern diagram of a first embodiment of the present invention. The display is a four-color organic light-emitting device (OLED) that is formed from a plurality of pixels 20 that emit light and are arranged in an array of rows and columns. Each pixel 20 includes a group of four individually addressable subpixels 20a, 20b, 20c, and 20d that emit different colored light. The subpixels are arranged into a 2×2 matrix within the pixel area. Pixel 20 is shown as including equal-sized red-, green-, blue-, and white-emitting subpixels (RGBW). However, it will be understood that subpixels 20a, 20b, 20c, and 20d for this embodiment and any other embodiment of this invention can include any combination of colors of the four subpixels that provide desired display properties. In the RGBW embodiment, the color of the white-emitting subpixels constitutes a point in CIE color space between red, green, and blue, and is generally perceived as being white to the viewer.

In the embodiments described herein, the various light-emitting elements can have different efficiencies and lifetimes. To optimize a display device for various applications it is sometimes useful to use different sized elements. For example, in applications for which black-and-white use dominates, the additional white OLED elements can be increased in size. It should also be recognized that as the amount of luminance that is dedicated to the additional element is manipulated, it can also be desirable to change their relative sizes. In U.S. Pat. No. 6,366,025, Yamada describes an electroluminescent color display device having light-emitting elements having different areas to take into consideration the differing emission efficiencies and luminance ratios of the light-emitting elements. The concept described by Yamada can be applied to the display device of the present invention.

For the purposes of this invention, the organic EL media of the subpixels of each pixel of the OLED device can produce different colored light by a variety of methods. For example, the different colored subpixels of pixel 20 can include different organic EL media that produces different colored light for each subpixel, e.g. red, green, blue, and white light respectively. In another embodiment, the organic EL media can be common between the various different colored subpixels and be arranged to produce white light, and the subpixels can further include red, green, and blue color filters corresponding to three of each four subpixels of each pixel.

The display includes drive circuitry for each group of four subpixels. Drive circuitry is disposed relative to the organic EL media, by which it is meant that the drive circuitry is arranged in such a way as to drive the groups of four subpixels to emit light in the desired pattern or manner. The drive circuitry can include select lines, data lines, power lines, transistors and capacitors. The active matrix display includes drive circuitry disposed over the substrate.

The drive circuitry includes a single select line 113 shared for a single row of the array of pixels 20. Each row of pixels 20 includes its own select line 113. The select lines 113 are located with the first and second subpixels 20a and 20b located on one side while the third and fourth subpixels 20c and 20d are located on the other side. One row of pixels 20 is addressed at any given time by applying a voltage signal to that row's select line 113. When a row is selected, all four subpixels 20a, 20b, 20c, and 20d for each pixel 20 in that row are selected simultaneously. The drive circuitry further includes data lines 112a, 112b, 112c, and 112d that are shared for each column of the array of pixels and are approximately orthogonal to the select line 113, and are used to determine the brightness of each subpixel in the row. There are four data lines for each column of pixels 20, which is one data line per subpixel in a group of four subpixels. This allows the brightness level of all the subpixels 20a, 20b, 20c, and 20d to be set simultaneously while a row is selected. The drive circuitry further includes two power lines 111a and 111b per column of pixels. Since the power lines 111a and 111b are normally set to the same voltage for all subpixels, each power line can be arranged to power two different subpixels of each pixel 20. Two of the subpixels 20a and 20c can be connected to the first power line 111a, and the other two subpixels 20b and 20d are connected to the second power line 111b. In the embodiment depicted, the two power lines 111a and 111b are shared by the columns of the array of pixels 20. Other embodiments are possible wherein the two power lines 111a and 111b are shared by the rows of the array of pixels 20.

The drive circuitry for each subpixel includes a select transistor 120, a storage capacitor 130, a power transistor 140, and an electrical connection 10 that includes the first electrode (not shown) and connections thereto, and organic EL media 310 which is the organic light-emitting diode. The gate of a first select transistor 120 is connected to the select line 113 and a second terminal is connected to one of the data lines 112a, 112b, 112c, or 112d, with each subpixel having a separate data line. The third terminal of the select transistor 120 is connected to the gate of the power transistor 140 as well as to one side of storage capacitor 130. The storage capacitor 130 serves to hold the data line voltage while the select line 113 is not activated. The second side of the storage capacitor 130 is connected to a capacitor line (either the first capacitor line 114a or the second capacitor line 114b depending on the subpixel). Typically, all capacitors lines for all pixels are connected to a common voltage. The other terminals of the power transistor 140 are connected on one side to either the first power line 111a or the second power line 111b, and on the other side the organic EL media 310 of the corresponding subpixel. Typically, all power lines for all pixels are connected to a common voltage. The second electrode 320 of the organic EL element is typically common to all pixels. Organic EL media 310 is represented by a diode symbol in FIG. 1.

The drive circuitry operates in a manner well known in the art. Each row of pixels is selected by applying a voltage signal to the select line 113, which turns on the select transistor 120 for each subpixel. The brightness level for each subpixel is controlled by a voltage signal, which has been set on the data lines 112a, 112b, 112c, 112d. The storage capacitor 130 for each subpixel is then charged to the voltage level of the data line associated with that subpixel and maintains the data voltage until the row is selected again during the next image frame. The storage capacitor 130 is connected to the gate of the power transistor 140 so that the voltage level held on storage capacitor 130 regulates the current flow through the power transistor 140 to organic EL media 310 which is the organic light-emitting diode and thereby controls brightness. Each row is then unselected by applying a voltage signal to the select line 113, which turns off the select transistors 120. The data line 112a, 112b, 112c, and 112d voltages are then set to the levels desired for the next row and the select line of the next row is turned on. This is repeated for every row of pixels.

Figure 2:
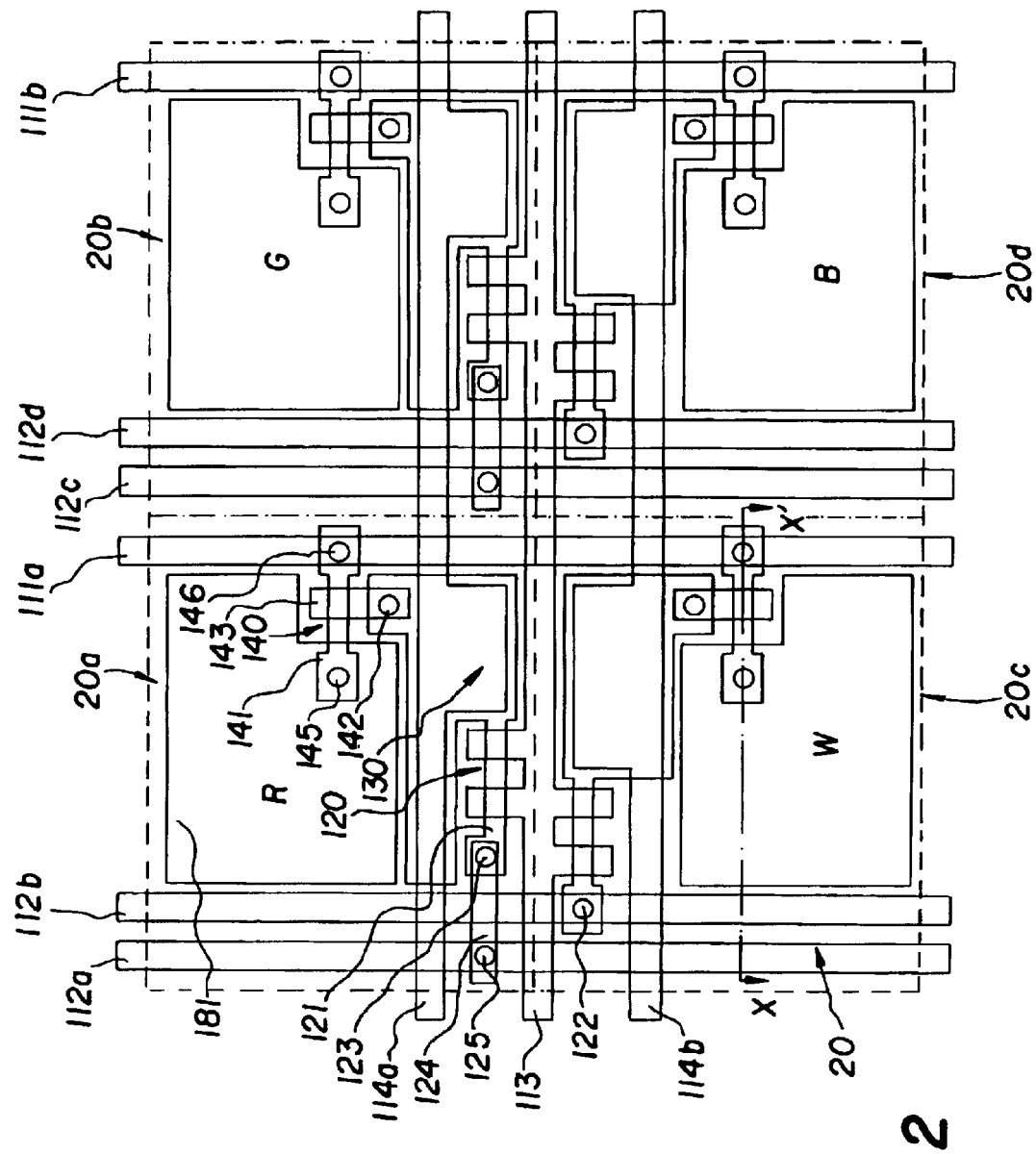
FIG. 2 shows a layout pattern diagram according to the above first embodiment of the present invention.

FIG. 2 shows a layout pattern diagram for the above first embodiment of the invention. The drive circuitry components are fabricated using conventional integrated circuit technologies. For each subpixel, the select transistor 120 is formed from a first semiconductor region 121 using techniques well known in the art. Similarly, the power transistor 140 can be formed in a second semiconductor region 141. The first semiconductor region 121 and second semiconductor region 141 are typically formed in the same semiconductor layer. This semiconductor layer is typically silicon which can be amorphous, polycrystalline, or crystalline. This first semiconductor region 121 also forms one side of the storage capacitor 130. Over the first semiconductor region 121 and second semiconductor region 141 is an insulating layer (not shown) that forms the gate insulator of the select transistor 120, the gate insulator for power transistor 140, and the insulating layer of the storage capacitor 130. The gate of the select transistor 120 is formed from part of the select line 113, which is formed in the first conductor layer. The power transistor 140 has a separate power transistor gate 143 also preferably formed in the first conductor layer. The other electrode of the storage capacitor 130 is formed as part of capacitor line 114a, also preferably formed from the first conductive layer. The first and second power lines 111a and 111b and the first, second, third, and fourth data lines 112a, 112b, 112c, and 112d, respectively, are preferably formed in a second conductive layer. One or more of the signal lines (e.g. select line 113) frequently cross at least one or more of the other signal lines (e.g. data line 112a), which requires these lines to be fabricated from multiple conductive layers with at least one interlayer insulating layer (not shown). In order to connect the first semiconductor region to a particular data line, another data line can be crossed. Such is the case for subpixels 20a and 20b as arranged in FIG. 3. In this case, a conductive bridge 124 can be used. The conductive bridge can be formed from the first conductor layer. Use of the conductive bridge is not required for successful implementation of the present invention and other embodiments where the first semiconductor region 121 crosses a data line to connect to another data line can be achieved by those skilled in the art. For other subpixels, such as 20c and 20d as arranged in FIG. 3, no data lines are crossed and the first semiconductor region can be connected directly to the appropriate data line. The organic EL element is formed by patterning a first electrode 181 for each pixel as well as depositing one or more layers of organic EL media (not shown) and a second electrode (not shown).

Connections between layers are formed by etching holes (or vias) in the insulating layers such as the first bridge via 123 connecting the first semiconductor region 121 to the conductive bridge 124, the second bridge via 125 connecting the conductive bridge 124 to data line 112a for subpixels having a conductive bridge. For pixels not having a conductive bridge, there is a first via 122 connecting data line 112a to the first semiconductor region 121 of the select transistor 120. Other vias include the second via 142 connecting the power transistor gate 143 to first semiconductor region 121 of the storage capacitor 130 and the select transistor 120, the third via 146 connecting the second semiconductor region 141 of the power transistor to power line 111a, and the fourth via 145 connecting the second semiconductor region 141 of the power transistor to the first electrode 181.

Figure 3:
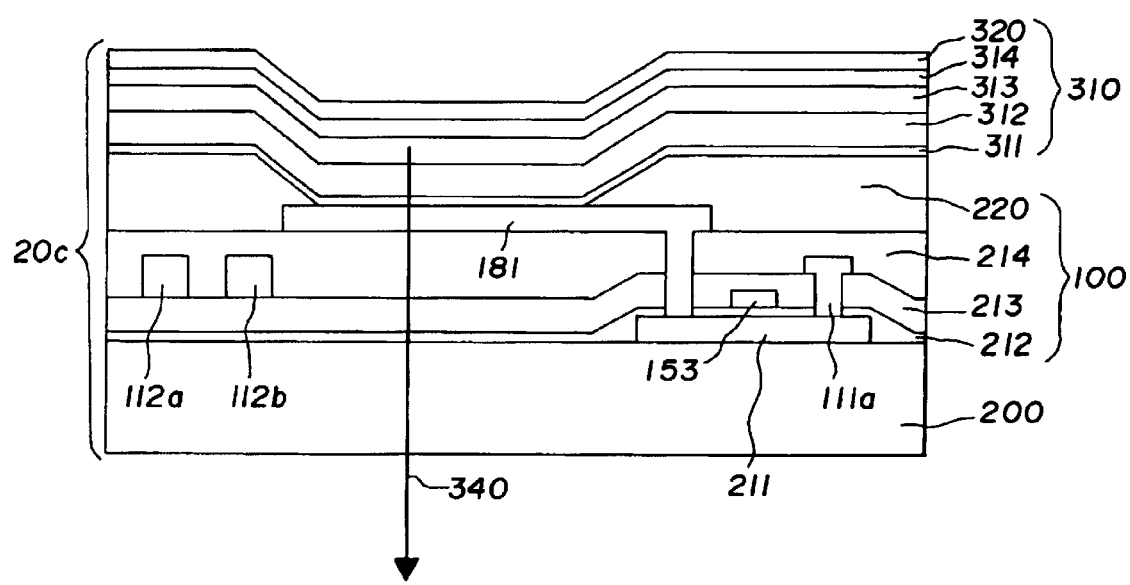
FIG. 3 shows a cross sectional view of a device according to the present invention.

FIG. 3 shows a cross section of subpixel 20c of the device along line X–X' as shown in FIG. 2. The OLED device of this invention and the subpixels therein are typically disposed as shown over a supporting substrate 200. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing, or light reflective. Substrates for use in this case include, but are not limited to, glass, plastic, semiconductor materials, silicon, ceramics, and circuit board materials.

FIG. 3 shows the vertical arrangement of the various layers and the spaced apart first and second electrodes 181 and 320 included in each subpixel (e.g., 20c). The drive circuitry 100 is disposed over substrate 200 and under organic EL media 310 in a manner herein described. Over the substrate 200, a semiconductor layer 211 is formed, doped, and patterned. A gate insulating layer 212 is formed over the semiconductor layer 211. Over the gate insulating layer 212, a gate conductor 153 is formed from a first conductor layer. The semiconductor layer 211 is then doped to form source and drain regions on either sides of the gate conductor 153 by well known methods. A first interlayer insulator layer 213 is formed over the gate conductor 153. Over the first interlayer insulator layer 213, a second conductor layer is deposited and patterned forming the first power lines (e.g. 111a) and the data lines (e.g. 112a and 112b). A second interlayer insulator layer 214 is formed over the power and data lines (e.g. 111a, 112a, etc.). The first electrode 181 of subpixel 20c is formed over the second interlayer insulator layer 214. The first electrode 181 is patterned. Around the edges of the first electrode 181, an electrode insulating film 220 is formed to reduce shorts between the first electrode 181 and the second electrode 320. Use of such electrode insulating films over the first electrode 181 is disclosed in U.S. Pat. No. 6,246,179. While use of the electrode insulating film 220 can have beneficial effects, it is not required for successful implementation of the invention.

The electrode nearest the substrate is conveniently referred to as the bottom electrode or first electrode 181. When EL emission is viewed through the first electrode 181, the first electrode should be transparent or substantially transparent to the emission of interest. Common transparent first electrode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the first electrode 181. For applications where EL emission is viewed only through the second electrode 320, the transmissive characteristics of first electrode 181 are immaterial and any conductive material can be used, transparent, opaque, or reflective. Example conductors for this application include, but are not limited to, gold, iridium, molybdenum, palladium, and platinum. The first electrode 181 is typically biased as the anode, but this invention is not limited to that configuration. Typical anode materials, transmissive or otherwise, have a work function of 4.1 eV or greater. Desired first electrode materials are commonly deposited by any suitable means such as evaporation, sputtering, chemical vapor deposition, or electrochemical means. First electrode 181 can be patterned using well known photolithographic processes. Optionally, first electrode 181 can be polished prior to application of other layers to reduce surface roughness so as to reduce shorts or enhance reflectivity.

Organic EL media 310 are disposed between the first and second electrodes, 181 and 320, respectively, of each subpixel. There are numerous organic EL layer structures known in the art wherein the present invention can be employed. For example, organic EL media 310 can include e.g. hole-injecting layer 311, hole-transporting layer 312, light-emitting layer 313, and electron-transporting layer 314.

While not always necessary, it is often useful to provide a hole-injecting layer 311 between first electrode 181 and hole-transporting layer 312. The hole-injecting layer 311 can serve to improve the film formation property of subsequent organic layers and to facilitate injection of holes into the hole-transporting layer 312. Suitable materials for use in the hole-injecting layer 311 include, but are not limited to, porphyrinic compounds as described in U.S. Pat. No. 4,720,432, plasma-deposited fluorocarbon polymers as described in U.S. Pat. Nos. 6,127,004, 6,208,075, and 6,208,077, and some aromatic amines, for example, m-MTDATA (4,4',4"-tris[(3-methylphenyl)phenylamino]-triphenylamine). Alternative hole-injecting materials for organic EL devices are described in EP 0 891 121 A1 and EP 1 029 909 A1.

The hole-transporting layer 312 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer 312 can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine Another class of useful hole-transporting materials includes polycyclic aromatic compounds as described in EP 1 009 041. Tertiary aromatic amines with more than two amine groups can be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

As more fully described in U.S. Pat. Nos. 4,769,292 and 5,935,721, the light-emitting layer (LEL) 313 of subpixel 20c includes a luminescent or fluorescent material where electroluminescence is produced as a result of electron-hole pair recombination in this region, producing light 340. Light 340 is shown for a bottom-emitting device, but it will be understood that subpixel 20c can be a top-emitting device in other embodiments. The light-emitting layer 313 can be comprised of a single material, but more commonly consists of a host material doped with a guest compound or compounds where light emission comes primarily from the dopant and can be of any color. The host materials in the light-emitting layer 313 can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes, e.g., poly(p-phenylenevinylene), PPV, can also be used as the host material. In this case, small molecule dopants can be molecularly dispersed into the polymeric host, or the dopant can be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material. For phosphorescent emitters, it is also important that the host triplet energy level of the host be high enough to enable energy transfer from host to dopant.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo{f}-8-quinolinolato]zinc(II)

CO-4: Bis(2-methyl-8-quinolinolato)aluminum(III)-$\mu$-oxo-bis(2-methyl-8-quinolinolato)aluminum(III)

CO-5: Indium trisoxine [alias, tris(8-quinolinolato) indium]

CO-6: Aluminum tris(5-methyloxine) [alias, tris(5-methyl-8-quinolinolato)aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato) zirconium(IV)]

Other classes of useful host materials include, but are not limited to, derivatives of anthracene, such as 9,10-di-(2-naphthyl)anthracene, and derivatives thereof as described in U.S. Pat. No. 5,935,721, distyrylarylene derivatives as described in U.S. Pat. No. 5,121,029, and benzazole derivatives, for example, 2,2',2"-(1,3,5-phenylene)tris[1-phenyl-1H-benzimidazole]. Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostyryl compounds.

Preferred thin film-forming materials for use in forming the electron-transporting layer 314 of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

The second electrode 320 is typically biased as the cathode. When light emission is viewed solely through substrate 200, the second electrode 320 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injecting layer (EIL) in contact with the organic layer (e.g., electron-transporting layer 314) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When light emission is viewed through the second electrode 320, the second electrode 320 must be transparent or nearly transparent. For such applications, metals must be thin or one must use transparent conductive oxides, or a combination of these materials. Optically transparent cathodes have been described in more detail in U.S. Pat. Nos. 4,885,211 and 5,247,190; JP 3,234,963; U.S. Pat. Nos. 5,703,436; 5,608,287; 5,837,391; 5,677,572; 5,776,622; 5,776,623; 5,714,838; 5,969,474; 5,739,545; 5,981,306; 6,137,223; 6,140,763; 6,172,459; EP 076 368; and U.S. Pat. Nos. 6,278,236 and 6,284,393. Materials for second electrode 320 are typically deposited by evaporation, sputtering, or chemical vapor deposition.

In some instances, light-emitting layer 313 and electron-transporting layer 314 can optionally be replaced by a single layer that serves the function of supporting both light emission and electron transportation. It is also known in the art that emitting dopants can be added to the hole-transporting layer 312, which can serve as a host. Multiple dopants can be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, U.S. Patent Application Publication 2002/0025419, EP 1 182 244, U.S. Pat. Nos. 5,683,823; 5,503,910; 5,405,709; and 5,283,182.

Additional layers such as electron- or hole-blocking layers as taught in the art can be employed in devices of this invention. Hole-blocking layers are commonly used to improve efficiency of phosphorescent emitter devices, for example, as in U.S. Patent Application Publication 2002/0015859.

The organic materials above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats, or the materials can be premixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551, 5,851,709 and 6,066,357) and inkjet method (U.S. Pat. No. 6,066,357).

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

OLED devices of this invention can employ various well known optical effects in order to enhance its properties if desired. This includes, but is not limited to, optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display.

One embodiment uses a white-emitting organic EL material, which is coated over the entire pixel matrix area and filtered into red, green, and blue subpixels using a color filter array. White subpixels are then left unfiltered. A common configuration of the organic EL layers as taught in EP 1 187 235 is employed in this embodiment comprising a hole-injecting layer 311, a hole-transporting layer 312 doped with a yellow-emitting material such a rubrene, a light-emitting layer 313 doped with a blue-emitting material such as "2,5,8,11-tetra-tert-butyl perylene" (TBP), and an electron-transporting layer 314. Disposed over the organic EL layers is the second electrode 320. The second electrode 320 is common to all pixels and does not require precision alignment and patterning. When required, a color filter is disposed in a manner to filter white light so as to pass light of the desired color for the subpixel. The color filter will be disposed over second electrode 320 for a top-emitting device. The color filter will be disposed under first electrode 181 for a bottom-emitting device.

Figure 4:
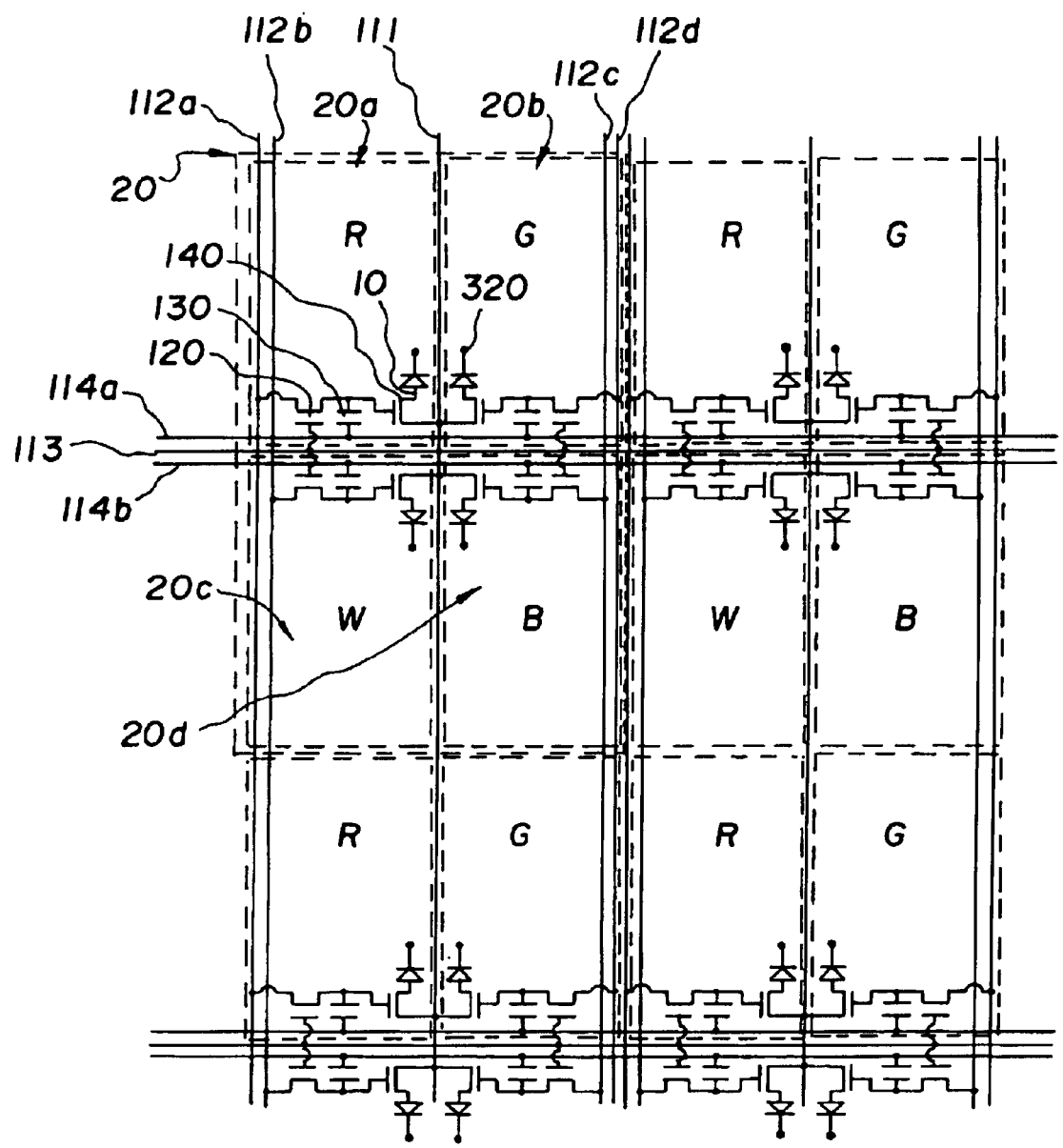
FIG. 4 shows a circuit pattern diagram according to a second embodiment of the present invention.

FIG. 4 shows a circuit pattern diagram arranged according to a second embodiment of the invention. Drive circuitry for each group of four subpixels includes four data lines 112a, 112b, 112c, and 112d, one power line 111, and one select line 113. In this embodiment, as in the first embodiment, the select lines 113 are shared for each corresponding row of the array of pixels and are located with first and second subpixels 20a and 20b located on one side of the select line 113, while the third and fourth subpixels 20c and 20d are located on the other side. This embodiment includes four data lines 112a, 112b, 112c, and 112d shared for each column of the array of pixels, that is, one data line for all subpixels of a given color in the column. Each column of pixels includes a single power line 111, which is disposed so that the first and third subpixels 20a and 20c are located on one side of power line 111, and the second and fourth subpixels 20b and 20d are located on the other side. It will be understood that power lines 111 can be formed instead in the direction of the pixel rows, and such orientation is understood to be within the scope of the present invention. In order to provide a single power line 111 per row of pixels, the layout of the drive circuitry 100 components (select transistor 120, storage capacitor 130, power transistor 140) for the second and fourth subpixels 20b and 20d is inverted relative to the layout of the first and third subpixels 20a and 20c. This device operates in the same manner as the device of FIG. 1.

Figure 5:
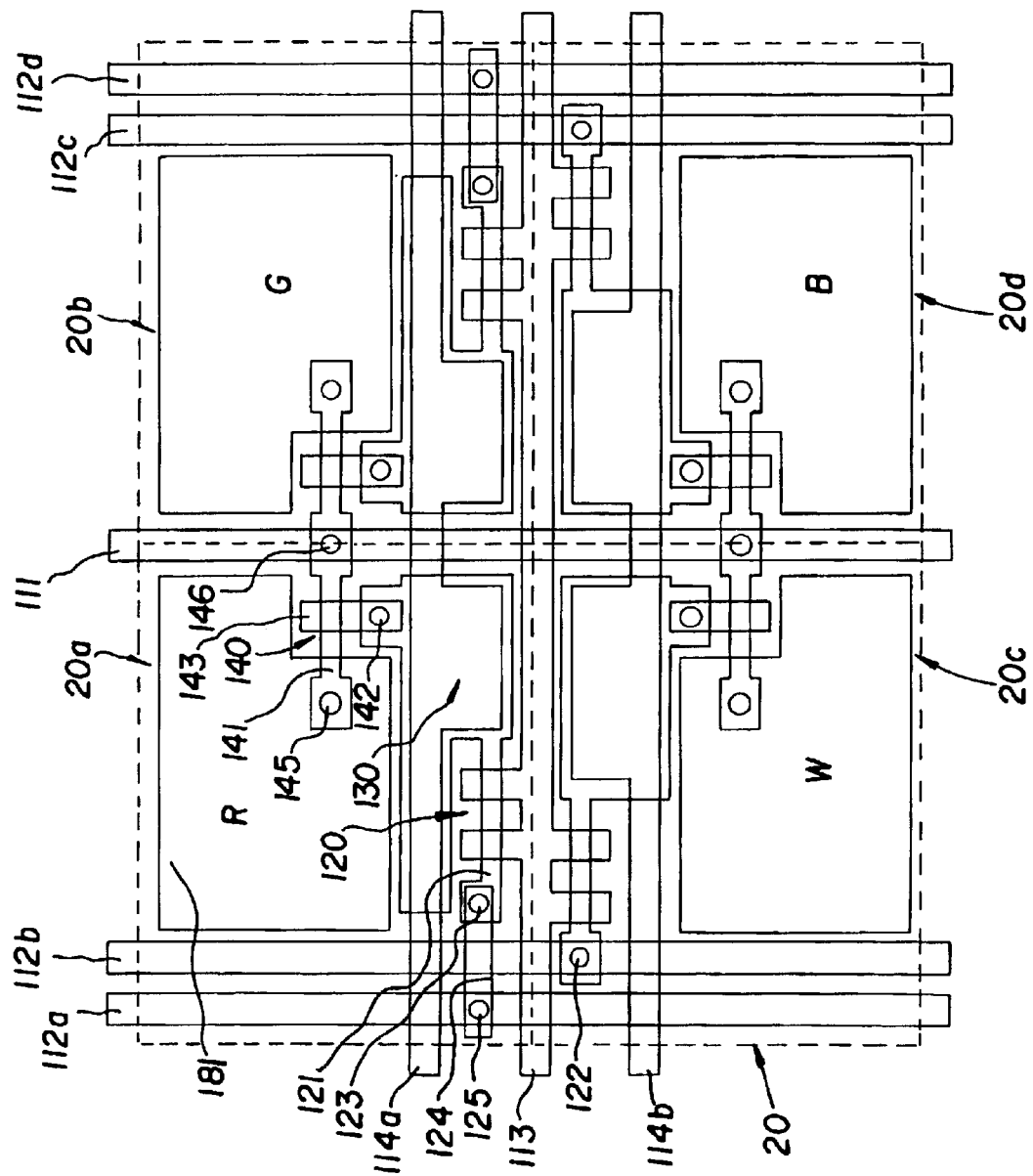
FIG. 5 shows a layout pattern diagram according to the above second embodiment of the present invention.

FIG. 5 shows a layout pattern diagram for the above second embodiment of this invention. It can be seen that the layout of the drive circuitry 100 components of the second and fourth subpixels 20b and 20d is inverted with respect to the layout of the first and third subpixels 20a and 20c in order to utilize a single power line 111.

Figure 6:
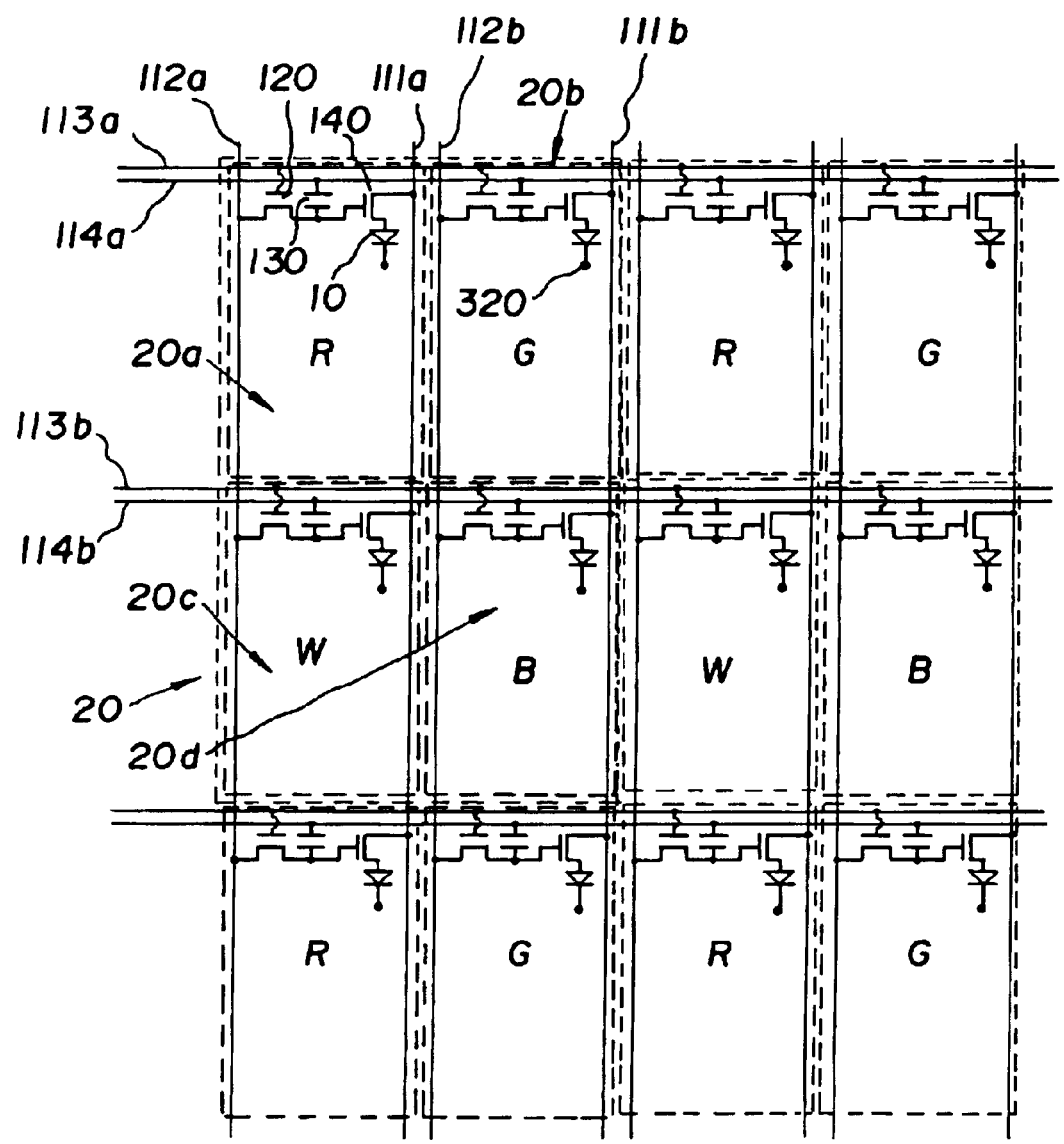
FIG. 6 shows a circuit pattern diagram according to a third embodiment of the present invention.

FIG. 6 shows a circuit pattern diagram arranged according to a third embodiment of the invention. The drive circuitry for each group of four subpixels includes two data lines 112a and 112b, two power lines 111a and 111b, and two select lines 113a and 113b. In this embodiment, the two select lines (first and second select lines 113a and 113b) are shared for each row of the array of pixels, and each select line is arranged to activate two different subpixels of each pixel. The first and second subpixels 20a and 20b are activated by the first select line 113a, while the third and fourth subpixels 20b and 20d are activated by the second select line 113b. The configuration allows for each column of pixels to be operated by only two data lines (first and second data lines 112a and 112b) that are shared for each column of the array of pixels compared to four data lines in FIG. 1 and FIG. 4. As in FIG. 1, there are two power lines, a first power line 111a connected to the first and second subpixels 20a and 20b, and a second power line 111b connected to the third and fourth subpixels 20c and 20d.

The drive circuitry according to this embodiment of the invention is operated as has already been described for the embodiment of FIG. 1, except that each row of pixels 20 must be selected in two steps. After setting the voltage signals on data lines 112a and 112b, the first select line 113a activates subpixels 20a and 20b, and the voltage signals are loaded from the first and second data lines 112a and 112b to the storage capacitors of the first and second subpixels 20a and 20b, respectively. After setting new voltages on the data lines, the second select line 113b then activates subpixels 20c and 20d, and the voltage signals are loaded from data lines 112a and 112b to the storage capacitors of the third and fourth subpixels 20c and 20d, respectively. This is repeated for each row of pixels.

Figure 7:
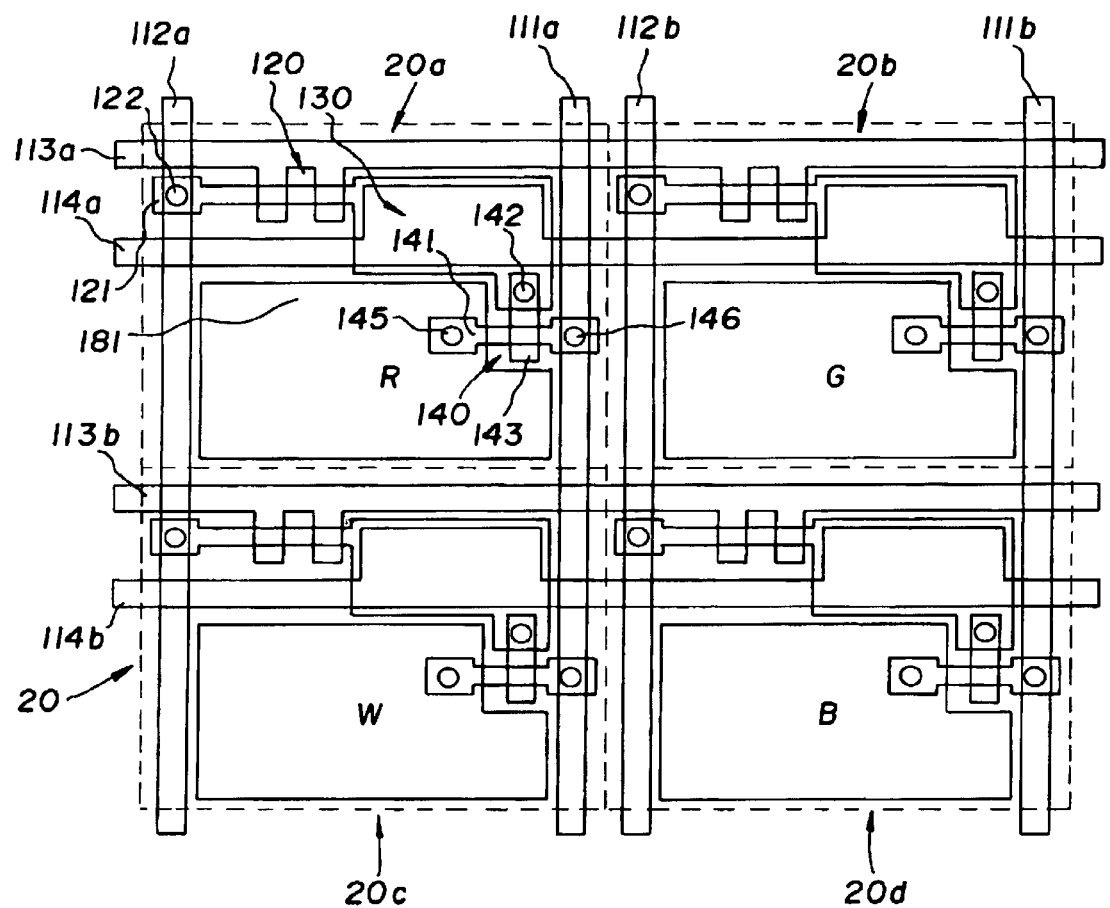
FIG. 7 shows a layout pattern diagram according to the above third embodiment of the present invention.

FIG. 7 shows a layout pattern diagram for the above third embodiment of the invention. It can be seen that the layout of the transistor and capacitor components of subpixels 20a and 20b are reversed relative to the same subpixels in FIG. 2 so as to facilitate the use of two select lines 113a and 113b.

Figure 8:
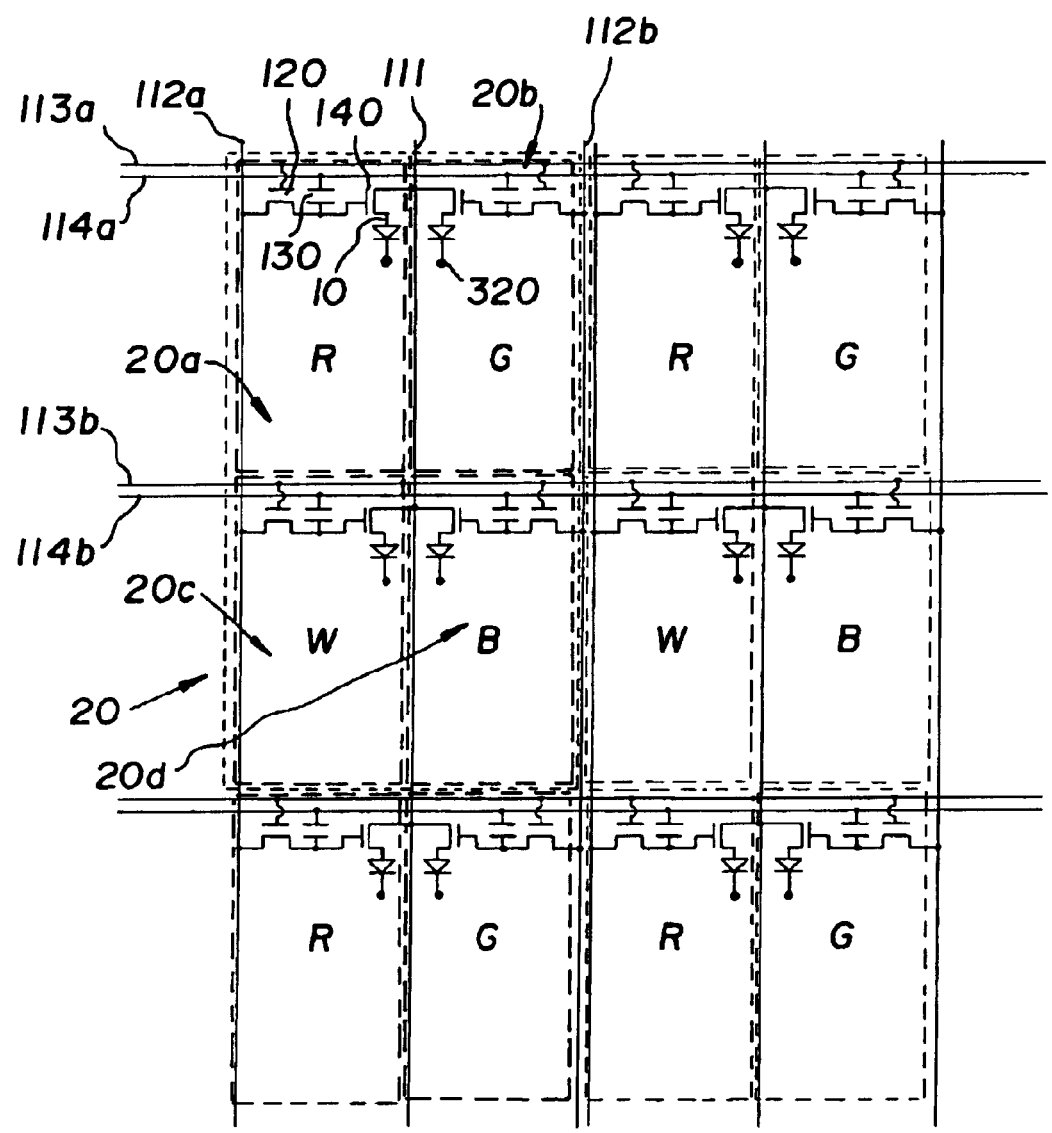
FIG. 8 shows a circuit pattern diagram according to a fourth embodiment of the present invention.

FIG. 8 shows a circuit pattern diagram arranged according a fourth embodiment of the invention. Drive circuitry for each group of four subpixels includes two data lines 112a and 112b, one power line 111, and two select lines 113a and 113b. As in the previous embodiment, two select lines (first and second select lines 113a and 113b) are shared for each row of the array of pixels 20, and each select line is arranged to activate two different subpixels of each pixel. The first and second subpixels 20a and 20b are activated by the first select line 113a, while the third and fourth subpixels 20b and 20d are activated by the second select line 113b. The configuration allows for each pixel to be operated by only two data lines (first and second data lines 112a and 112b) that are shared for each column of the array of pixels 20. As in the embodiment of FIG. 4, each column of pixels 20 includes only a single power line 111, which is located with the first and third subpixels 20a and 20c on one side, and the second and fourth subpixels 20b and 20d on the other side. In order to provide a single power line 111 per column of pixels, the layout of the drive circuitry 100 components (select transistor 120, storage capacitor 130, power transistor 140) for the second and fourth subpixels 20b and 20d are inverted relative to the layout of the first and third subpixels 20a and 20c. This configuration results in the least total surface area of the circuitry and connection lines of the embodiments described herein. A device according to this embodiment is operated in the same way as the device of FIG. 6, that is, each row of pixels 20 must be selected in two steps.

Figure 9:
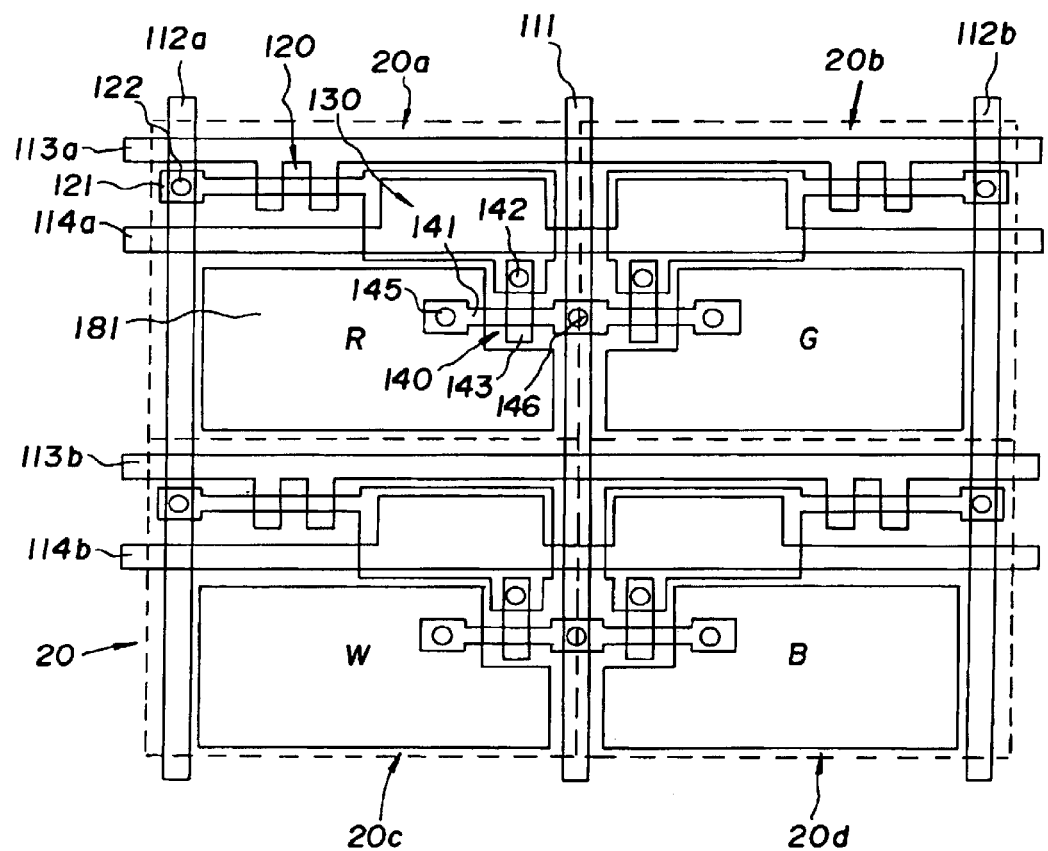
FIG. 9 shows a layout pattern diagram according to the above fourth embodiment of the present invention.

FIG. 9 shows a layout pattern diagram for the above fourth embodiment of the invention. It can be seen that the layout of the transistor and capacitor components of the second and fourth subpixels 20b and 20d is inverted with respect to the layout of the first and third subpixels 20a and 20c in order to utilize a single power line 111.

While the various embodiments described herein refer to a specific configuration of active matrix drive circuitry and pixel design, several variations of conventional circuits that are known in the art can also be applied to the present invention by those skilled in the art. For example, one variation in U.S. Pat. No. 5,550,066 connects the capacitors directly to the power line instead of a separate capacitor line. A variation in U.S. Pat. No. 6,476,419 uses two capacitors disposed directly over one and another, wherein the first capacitor is fabricated between the semiconductor layer 211 and the gate conductor layer that forms gate conductor 153, and the second capacitor is fabricated between the gate conductor layer and the second conductor layer that forms power lines 111 and data lines 112a, etc.

While the drive circuitry described herein requires a select transistor and a power transistor, several variations of these transistor designs are known in the art. For example, single- and multi-gate versions of transistors are known and have been applied to select transistors in prior art. A single-gate transistor includes a gate, a source and a drain. An example of the use of a single-gate type of transistor for the select transistor is shown in U.S. Pat. No. 6,429,599. A multi-gate transistor includes at least two gates electrically connected together and therefore a source, a drain, and at least one intermediate source-drain between the gates. An example of the use of a multi-gate type of transistor for the select transistor is shown in U.S. Pat. No. 6,476,419. This type of transistor can be represented in a circuit schematic by a single transistor or by two or more transistors in series in which the gates are connected, and the source of one transistor is connected directly to the drain of the next transistor. While the performance of these designs can differ, both types of transistors serve the same function in the circuit, and either type can be applied to the present invention by those skilled in the art. The example of the preferred embodiment of the present invention is shown with a multi-gate type select transistor 120 (in FIG. 2, FIG. 5, FIG. 7, and FIG. 9) which is represented by a single transistor symbol in the circuit schematic diagrams (in FIG. 1, FIG. 4, FIG. 6, and FIG. 8).

Also known in the art is the use multiple parallel transistors, which are typically applied to power transistor 140. Multiple parallel transistors are described in U.S. Pat. No. 6,501,448. Multiple parallel transistors consist of two or more transistors in which their sources connected together, their drains connected together, and their gates connected together. The multiple transistors are separated within the pixels so as to provide multiple parallel paths for current flow. The use of multiple parallel transistors has the advantage of providing robustness against variability and defects in the semiconductor layer manufacturing process. While the power transistors described in the various embodiments of the present invention are shown as single transistors, multiple parallel transistors can be used by those skilled in the art and are understood to be within the spirit of the invention.

While the various embodiments have been described with particular configuration of materials, many variations of the materials by which the present invention can be successfully practiced are known in the art. While a white-emitting organic EL material with a color filter array can be used to obtain a four subpixel device, four colors can also be obtained by using four different organic EL configurations, which are separately patterned over the subpixels.

The invention has been described in detail with particular reference to certain preferred embodiments thereof, but it will be understood that variations and modifications can be effected within the spirit and scope of the invention.

Parts List 10 electrical connection
20 pixel
20a subpixel
20b subpixel
20c subpixel
20d subpixel
100 drive circuitry
111 power line
111a power line
111b power line
112a data line
112b data line
112c data line
112d data line
113 select line
113a select line
113b select line
114a capacitor line
114b capacitor line
120 select transistor
121 first semiconductor region
122 via
123 first bridge via 124 conductive bridge
125 second bridge via
130 storage capacitor
140 power transistor
141 second semiconductor region
142 via
143 power transistor gate
145 via
146 via
153 gate conductor
181 first electrode
200 substrate
211 semiconductor layer
212 gate insulating layer
213 insulator layer
214 insulator layer
220 electrode insulating film
310 organic EL media
311 hole-injecting layer
312 hole-transporting layer
313 light-emitting layer
314 electron-transporting layer
320 second electrode
340 light

What is claimed is:

1. A four-color organic light-emitting device having pixels which emit light, comprising:
   a) a substrate;
   b) pixels arranged in rows and columns and each pixel including groups of four subpixels disposed over the substrate and wherein each subpixel includes spaced apart first and second electrodes;
   c) organic EL media disposed between the first and second electrodes of each subpixel;
   d) drive circuitry disposed relative to the organic EL media over the substrate and arranged to drive each group of four subpixels and having an electrical connection to the first electrode corresponding to each subpixel, and wherein
   e) the drive circuitry for each group of four subpixels including four data lines, two power lines, and one select line, the four data lines being shared for each column of the array of pixels, and the select line being shared for each row of the array of pixels.

2. The four-color organic light-emitting device of claim 1 wherein the two power lines are shared by the columns of the array of pixels.

3. The four-color organic light-emitting device of claim 1 wherein the two power lines are shared by the rows of the array of pixels.

4. The four-color organic light-emitting device of claim 1 wherein the drive circuitry includes at least two transistors and a capacitor for each subpixel.

5. The four-color organic light-emitting device of claim 1 wherein the organic EL media is arranged to produce white light and further including red, green, and blue color filters corresponding to three of each four subpixels of each pixel.

6. The four-color organic light-emitting device of claim 1 wherein the organic EL media of each subpixel of each pixel produces different colored light.

7. The four-color organic light-emitting device of claim 6 wherein the subpixels of each pixel produce red, green, blue, and white, respectively.

8. The four-color organic light-emitting device of claim 1 wherein the drive circuitry is disposed over the substrate and under the organic EL media.

9. The four-color organic light-emitting device of claim 1 wherein each power line is arranged to power two different subpixels of each pixel.

10. A four-color organic light-emitting device having pixels which emit light, comprising:
    a) a substrate;
    b) pixels arranged in rows and columns and each pixel including groups of four subpixels disposed over the substrate and wherein each subpixel includes spaced apart first and second electrodes;
    c) organic EL media disposed between the first and second electrodes of each subpixel;
    d) drive circuitry disposed relative to the organic EL media over the substrate and arranged to drive each group of four subpixels and having an electrical connection to the first electrode corresponding to each subpixel, and wherein
    e) the drive circuitry for each group of four subpixels including four data lines, one power line, and one select line, the four data lines being shared for each column of the array of pixels, and the select line being shared for each row of the array of pixels.

11. The four-color organic light-emitting device of claim 10 wherein the one power line is shared by the columns of the array of pixels.

12. The four-color organic light-emitting device of claim 10 wherein the one power line is shared by the rows of the array of pixels.

13. The four-color organic light-emitting device of claim 10 wherein the drive circuitry includes at least two transistors and a capacitor for each subpixel.

14. The four-color organic light-emitting device of claim 10 wherein the organic EL media is arranged to produce white light and further including red, green, and blue color filters corresponding to three of each four subpixels of each pixel.

15. The four-color organic light-emitting device of claim 10 wherein the organic EL media of each subpixel of each pixel produces different colored light.

16. The four-color organic light-emitting device of claim 15 wherein the subpixels of each pixel produce red, green, blue, and white, respectively.

17. The four-color organic light-emitting device of claim 10 wherein the drive circuitry is disposed over the substrate and under the organic EL media.

18. A four-color organic light-emitting device having pixels which emit light, comprising:
    a) a substrate;
    b) pixels arranged in rows and columns and each pixel including groups of four subpixels disposed over the substrate and wherein each subpixel includes spaced apart first and second electrodes;
    c) organic EL media disposed between the first and second electrodes of each subpixel;
    d) drive circuitry disposed relative to the organic EL media over the substrate and arranged to drive each group of four subpixels and having an electrical connection to the first electrode corresponding to each subpixel, and wherein
    e) the drive circuitry for each group of four subpixels including two data lines, two power lines, and two select lines, the two data lines being shared for each column of the array of pixels, and the select lines being shared for each row of the array of pixels.

19. The four-color organic light-emitting device of claim 18 wherein the two power lines are shared by the columns of the array of pixels.

20. The four-color organic light-emitting device of claim 18 wherein the two power lines are shared by the rows of the array of pixels.

21. The four-color organic light-emitting device of claim 18 wherein the drive circuitry includes at least two transistors and a capacitor for each subpixel.

22. The four-color organic light-emitting device of claim 18 wherein the organic EL media is arranged to produce white light and further including red, green, and blue color filters corresponding to three of each four subpixels of each pixel.

23. The four-color organic light-emitting device of claim 18 wherein the organic EL media of each subpixel of each pixel produces different colored light.

24. The four-color organic light-emitting device of claim 23 wherein the subpixels of each pixel produce red, green, blue, and white, respectively.

25. The four-color organic light-emitting device of claim 18 wherein the drive circuitry is disposed over the substrate and under the organic EL media.

26. The four-color organic light-emitting device of claim 18 wherein each select line is arranged to activate two different subpixels of each pixel.

27. The four-color organic light-emitting device of claim 18 wherein each power line is arranged to power two different subpixels of each pixel.

28. A four-color organic light-emitting device having pixels which emit light, comprising:
   a) a substrate;
   b) pixels arranged in rows and columns and each pixel including groups of four subpixels disposed over the substrate and wherein each subpixel includes spaced apart first and second electrodes;
   c) organic EL media disposed between the first and second electrodes of each subpixel;
   d) drive circuitry disposed relative to the organic EL media over the substrate and arranged to drive each group of four subpixels and having an electrical connection to the first electrode corresponding to each subpixel, and wherein
   e) the drive circuitry for each group of four subpixels including two data lines, one power line, and two select lines, the two data lines being shared for each column of the array of pixels, and the select lines being shared for each row of the array of pixels.

29. The four-color organic light-emitting device of claim 28 wherein the power line is shared by the columns of the array of pixels.

30. The four-color organic light-emitting device of claim 28 wherein the power line is shared by the rows of the array of pixels.

31. The four-color organic light-emitting device of claim 28 wherein the drive circuitry includes at least two transistors and a capacitor for each subpixel.

32. The four-color organic light-emitting device of claim 28 wherein the organic EL media is arranged to produce white light and further including red, green, and blue color filters corresponding to three of each four subpixels of each pixel.

33. The four-color organic light-emitting device of claim 28 wherein the organic EL media of each subpixel of each pixel produces different colored light.

34. The four-color organic light-emitting device of claim 33 wherein the subpixels of each pixel produce red, green, blue, and white, respectively.

35. The four-color organic light-emitting device of claim 28 wherein the drive circuitry is disposed over the substrate and under the organic EL media.

36. The four-color organic light-emitting device of claim 28 wherein each select line is arranged to activate two different subpixels of each pixel.

* * * * *